United States Patent
Muhammad et al.

(10) Patent No.: US 8,903,014 B2
(45) Date of Patent: *Dec. 2, 2014

(54) COMMUNICATIONS DEVICE HAVING CONTROLLER TO CORRECT AN INITIAL IQ IMBALANCE AND ASSOCIATED METHODS

(75) Inventors: Khurram Muhammad, Garland, TX (US); Oleksiy Kravets, Petersburg (CA)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/397,067

(22) Filed: Feb. 15, 2012

(65) Prior Publication Data

US 2013/0208770 A1 Aug. 15, 2013

(51) Int. Cl.
*H04K 1/02* (2006.01)
*H04L 25/03* (2006.01)
*H04L 25/49* (2006.01)

(52) U.S. Cl.
USPC .......................................................... 375/296

(58) Field of Classification Search
USPC .......................................................... 375/296
See application file for complete search history.

(56) References Cited

U.S. PATENT DOCUMENTS

| 7,856,048 | B1 | 12/2010 | Smaini et al. | |
|---|---|---|---|---|
| 2001/0048715 | A1* | 12/2001 | Lee et al. | 375/219 |
| 2007/0190952 | A1* | 8/2007 | Waheed et al. | 455/114.3 |
| 2010/0111221 | A1 | 5/2010 | Nash et al. | |
| 2011/0150130 | A1* | 6/2011 | Kenington | 375/296 |
| 2013/0094610 | A1* | 4/2013 | Ghannouchi et al. | 375/296 |

* cited by examiner

*Primary Examiner* — Tanmay Shah
(74) *Attorney, Agent, or Firm* — Allen, Dyer, Doppelt, Milbrath & Gilchrist, P.A.

(57) ABSTRACT

A communications device includes a plurality of wireless transmitters operable at different respective frequencies and each configured to generate respective IQ signals having an initial IQ imbalance. The communications device also includes a frequency tunable auxiliary receiver, and a controller. The controller is configured to selectively couple a given wireless transmitter to the frequency tunable auxiliary receiver and tune the frequency tunable auxiliary receiver to a frequency of the given wireless transceiver, and apply predistortion to the given wireless transmitter based upon the initial IQ imbalance to reduce the initial IQ imbalance.

9 Claims, 3 Drawing Sheets

COMMUNICATIONS DEVICE HAVING CONTROLLER TO CORRECT AN INITIAL IQ IMBALANCE AND ASSOCIATED METHODS

TECHNICAL FIELD

The present disclosure relates to the field of communications devices, and more particularly, communications devices with components that correct initial IQ imbalances.

BACKGROUND

In general, undesired or non-ideal characteristics, such as DC offset and in-phase/quadrature-phase (IQ) imbalance, degrade performance of mobile transceivers. The DC offset is the effect of self mixing by a mixer, and occurs when a signal of a local oscillator (LO) returns after leaking toward an antenna or when a radio frequency (RE) modulation signal input through the antenna is leaked to the local oscillator. Another way to create DC offset is through an inherent offset in the amplifiers due to imbalances. If the DC offset is amplified by amplifiers in the signal path, then this way may saturate a baseband circuit.

The IQ imbalance is caused when the phase difference between the in-phase (I) channel signal and the quadrature-phase (Q) channel signal generated in an oscillator of a wireless transmitter is not 90 degrees. The IQ imbalance can be reduced by designing mixers of the I channel demodulator and the Q channel demodulator to be precisely 90 degrees in phase delay (i.e., orthogonal) to each other. However, designing the mixers so that there is precisely a 90 degrees phase difference to each other is not practical over process and temperature variations. This is because in the layout, the I and Q paths to the mixers traverse different lengths despite the best effort of keeping everything symmetrical. This is especially true for multi-band systems. An IQ imbalance increases the Bit Error Rate (BER), thereby degrading the performance of the wireless transceiver.

However, there is still a need to improve such compensation, and a need to reduce IQ imbalances and the associated distortion in mobile transmitters.

DETAILED DESCRIPTION

Figure 1:
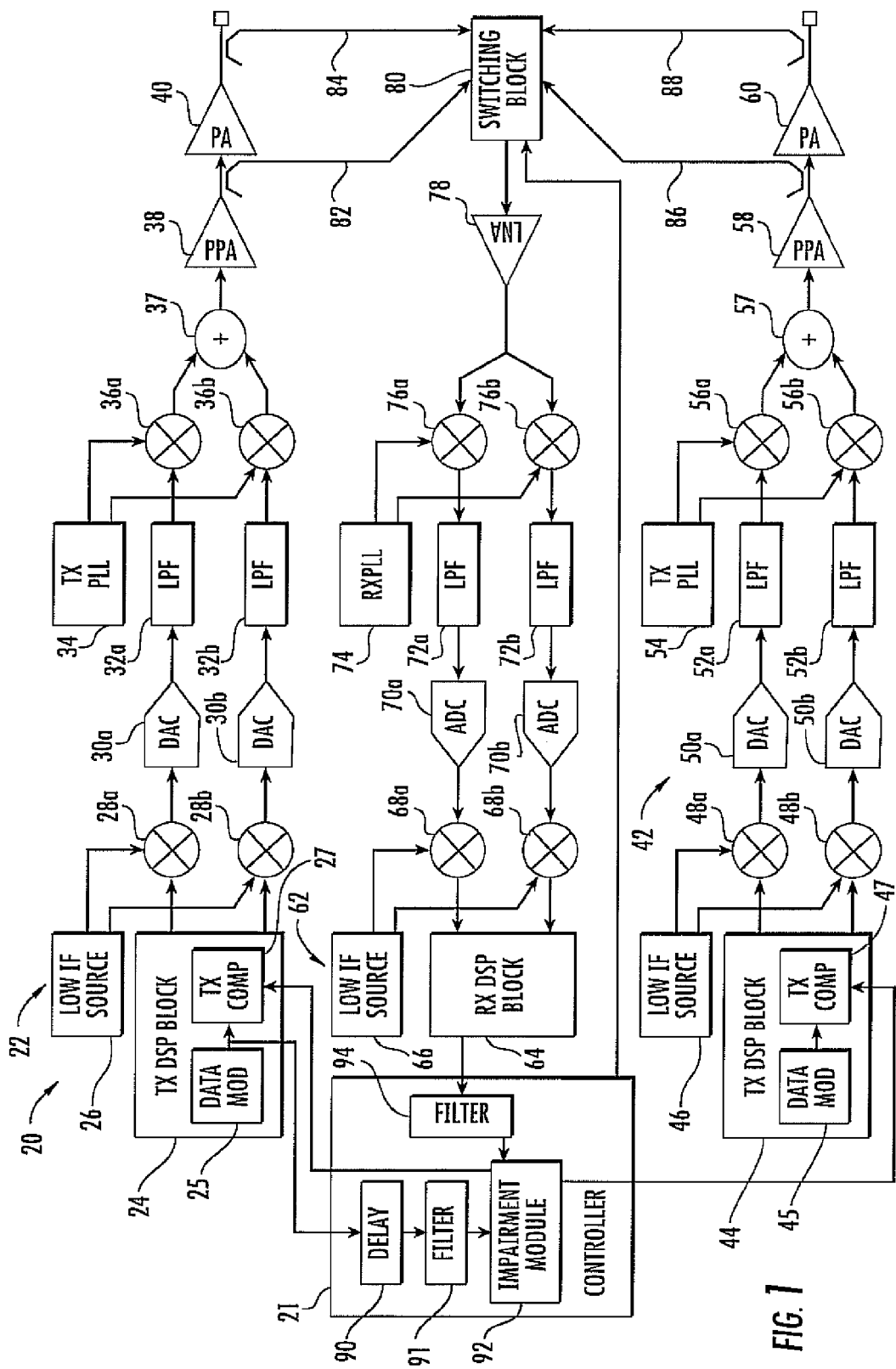
FIG. 1 is a schematic block diagram of a first embodiment of a communications device the present disclosure.

The present description is made with reference to the accompanying drawings, in which various embodiments are shown. However, many different embodiments may be used, and thus the description should not be construed as limited to the embodiments set forth herein. Rather, these embodiments are provided so that this disclosure will be thorough and complete. Like numbers refer to like elements throughout, and prime notation is used to indicate similar elements or steps in alternative embodiments.

Generally speaking, a communications device may include a plurality of wireless transmitters operable at different respective frequencies and each configured to generate respective IQ signals having an initial IQ imbalance. The communications device may also include a frequency tunable auxiliary receiver, and a controller.

The controller may be configured to selectively couple a given wireless transmitter to the frequency tunable auxiliary receiver and tune the frequency tunable auxiliary receiver to a frequency of the given wireless transceiver, and apply predistortion to the given wireless transmitter based upon the initial IQ imbalance to reduce the initial IQ imbalance.

This communications device advantageously allows a single auxiliary receiver to provide feedback for multiple transmitters, saving space and reducing the cost of the communications device.

The communications device may also include a switching block coupled to the controller, the frequency tunable auxiliary receiver, and to each of the plurality of transmitters and operated by the controller. In addition, each wireless transmitter may comprise a digital signal processing (DSP) block configured to receive an input baseband signal and to generate the IQ signal having the IQ imbalance. The controller may be configured to apply predistortion by generating and applying a predistortion signal to the DSP block.

Each wireless transmitter may further comprise at least one digital to analog converter (DAC) coupled downstream of the DSP block. In addition, each wireless transmitter may include at least one mixer coupled downstream of the at least one DAC. A phase locked loop (PLL) coupled to the at least one mixer. Further, there may be at least one power amplifier downstream from the at least one mixer.

The frequency tunable auxiliary receiver may comprise a low noise amplifier (LNA), and at least one mixer coupled downstream of the LNA. The frequency tunable auxiliary receiver may also include a receiver phase locked loop (RX-PLL) coupled to the at least one mixer, the RXPLL being tunable to the frequencies of the plurality of wireless transceivers. At least one analog to digital converter (ADC) may be coupled downstream of the at least one mixer, and a receiver DSP block may be coupled to the at least one ADC.

A method aspect is directed to a method of operating a communications device comprising a plurality of wireless transmitters operable at different respective frequencies and each configured to generate respective IQ signals having an initial IQ imbalance, a frequency tunable auxiliary receiver, and a controller. The method may comprise selectively coupling a given wireless transmitter to the frequency tunable auxiliary receiver and tune the frequency tunable auxiliary receiver to a frequency of the given wireless transceiver, using the controller, and applying predistortion to the given wireless transmitter based upon the initial IQ imbalance to reduce the initial IQ imbalance, using the controller.

With reference to FIG. 1, a communications device 20 is now described. The communications device 20 may be a mobile wireless communications device, such as a smartphone. The communications device 20 may be a multi-frequency band device that operates over a 2.4 GHz frequency band (i.e., approximately 2.4 to 2.483 GHz) and over a 5 GHz frequency band (i.e., approximately 4.9 to 6 GHz), for example. Depending on the intended application, the communications device 20 may operate over other frequency bands, as readily appreciated by those skilled in the art.

The communications device 20 includes a plurality of transmitters 22, 42, and a tunable auxiliary receiver 62. As will be explained in detail below, a controller 21 uses the tunable auxiliary receiver 62 to detect impairments such as initial IQ imbalances in signals output by the transmitters 22, 42 and directs the digital signal processing (DSP) blocks 24, 44 of the transmitters to correct input baseband signals so as to reduce the IQ imbalance in the signals output by the transmitters. The tunable auxiliary receiver 62 is coupled to one of the transmitters 24, 44 at a time by the switching block 80, and is tunable to receive different frequencies so as to be able to service different transmitters operating at different frequencies.

The transmitter 22 will now be described in details. The transmitter 22 includes a transmit (TX) DSP block 24 configured to output baseband signal having in-phase (I) and quadrature (Q) components and to therefore generate and output complex IQ signals. The complex IQ signals have an IQ imbalance caused by other components of the transmitter 22, meaning that there may be a phase imbalance between the I and Q signals (e.g. I and Q are not 90° apart in phase). The TX DSP block 24 comprises a data modulator 25 that generates the baseband signal, and a transmit compensator (TX compensator) 27 coupled thereto. As will be explained below, the controller 21 corrects the initial IQ imbalance using the TX compensator 27.

The I and Q outputs from the TX DSP block 24 are mixed by the mixers 28a, 28b to a low intermediate frequency (IF) by a low IF source 26 coupled to the mixers. Digital to analog converters (DACs) 30a, 30b are coupled to the mixers 28a, 28b, and low pass filters 32a, 32b are coupled to the DACs.

Mixers 36a, 36b are coupled to the low pass filters 32a, 32b. The complex IQ signals are driven to the desired transmit frequency by the transmitter phase locked loop 34, which is coupled to the mixers 36a, 36b. The complex IQ signals (now at the desired transmit frequency) are summed by the summer 37, and then fed downstream to a pre-power amplifier 38, and in turn to a power amplifier 40. The power amplifier 40 outputs a RF modulated signal having the initial IQ imbalance. The pre-power amplifier 38 is used to ensure that there is enough power to drive the power amplifier 40.

The transmitter 42 contains similar components to the transmitter 22 and needs no further discussion herein, although it should be understood that the transmitter 42 may operate in a different frequency band than the transmitter 22. In addition, it should be understood that the communications device 20 may include any numbers of transmitters, and that they may be similar to the transmitters 22, 42, or may be different kinds of transmitters. The transmitters 22, 42 are each coupled to the switching block 80, which is in turn coupled to the frequency tunable auxiliary receiver 62.

An RF modulated signal having the initial IQ imbalance from a transmitter 22, 42 is provided to the frequency tunable auxiliary receiver 62 using a non-directional coupler 82, 86 coupled between the pre-power amplifier 38, 58 and the power amplifier 40, 60. Alternatively, a non-directional coupler 84, 88 may be coupled between the power amplifier 40, 60 and the antenna (not shown).

An advantage of using a non-directional coupler 82, 86 is that it can operate over a wide band of operation, and its performance remains well controlled over temperature and frequency changes. In addition, a non-directional coupler 82, 86 helps to prevent the PLL 74 of the frequency tunable auxiliary receiver 62 from parasitically coupling to the output of the transmitter 16. Instead of using a non-directional coupler, it is possible to use a directional coupler. The use of a directional coupler provides a steady feedback signal independent of the VSWR variation at the antenna or the PPA load. However, a non-directional coupler is preferred because it is wideband and simpler to implement.

The switching block 80 couples one of the transmitters 22, 42 at a time to the frequency tunable auxiliary receiver 62 via the couplers 82, 86, 84, 88. The frequency tunable auxiliary receiver 62 is used to service the needs of the transmitters 22, 42. Estimation and compensation for IQ imbalance and DC offset are examples of servicing the needs of the transmitters 22, 42, as will be appreciated by those skilled in the art.

The frequency tunable auxiliary receiver 62 can be of lower performance as compared to a main receiver (not shown) of the communications device 20 since it is primarily designed to serve the transmitters 22, 42. For example, the frequency tunable auxiliary receiver 62 may not need to have a high dynamic range like a main receiver, nor a high selectivity.

The frequency tunable auxiliary receiver 62 is configured to have an independent, dedicated phase-locked loop 74 that is offset from the TX PLL 34, 54 operating the transmitters 22, 42. This advantageously allows the initial IQ imbalance, to be separated in the frequency domain from IQ imbalances or other impairments added in the frequency tunable auxiliary receiver 62.

As explained above, the auxiliary receiver 62 includes a low noise amplifier 78 to receive the RF modulated signal having the IQ imbalance. The output of the low noise amplifier 78 is provided to the mixers 76a, 76b. The frequency tunable auxiliary receiver 62 is configured as a 0-IF receiver since the transmitters 22, 42 are is configured as low-IF transmitters (i.e., dual-mixer mode). This means that a second set of mixers 68a, 68b may not be needed and is selectively set to a value of 1 (i.e., $e^{j0}$) by the low IF source 66. In a different embodiment, the switching block 80 can be combined with the LNA 78 to provide two input pairs, one of which is selected under software control.

The mixers 76a, 76b receive the RF modulated signal having the IQ imbalance, and I and Q local oscillator signals from the RX PLL 74. As noted above, the frequency tunable auxiliary receiver 62 is configured to have an independent, dedicated phase-locked loop 74 that is offset from the PLL's 34, 54 of the transmitters 22, 42. This advantageously allows the initial IQ imbalance in the RF modulated signal to be separated in the frequency domain from impairments added in the frequency tunable auxiliary receiver 62.

The output of the mixers 76a, 76b provide receive modulated analog I and Q component signals at the intermediate frequency. These signals are provided to low pass filters 72a, 72b and then to analog-to-digital converters 70a, 70b so that the receive baseband modulated analog I and Q component signals are now receive baseband modulated digital I and Q component signals at the intermediate frequency. The receive baseband modulated digital I and Q component signals at the intermediate frequency include the receive impairment (initial IQ imbalance) spectrally separated from the transmit impairment. These signals are passed through the mixers 68a, 68b, which translate this complex signal to zero-IF in a second down-conversion operation by frequency using the low IF source 46.

The controller 21 is coupled to the output of the data modulator 25, 45 and to the output of the frequency tunable auxiliary receiver 62. The controller 21 receives the transmit baseband modulated signal from the data modulator 25, 45. The transmit baseband modulated signal is also referred to as the reference signal since it does not include the initial IQ imbalance from the transmitters 22, 42.

The controller 21 also receives the receive baseband modulated signal as provided by the auxiliary receiver 62. The receive baseband modulated signal includes the transmit baseband modulated signal as well as the receive impairment spectrally separated from the transmit impairment.

The controller 21 includes a delay circuit 90 configured to delay the transmit baseband modulated signal so that this signal and the receive baseband modulated signal match up in time when compared. The delay circuit 90 may be configured to implement a fixed delay corresponding to inherent delays of the transmitters 22, 42 and the auxiliary receiver 62, and a variable delay corresponding to variable environmental conditions. The variable delay accounts for environmental conditions, such as operating temperature variations, for example. In particular, the analog sections within the transmitter 22, 42 and the auxiliary receiver 62 are affected by temperature variations.

The impairment module 92 within the controller 21 estimates the IQ imbalance and other impairment within the selected transmitter 22, 42, and generates an IQ or impairment compensation signal for that transmitter based on the estimated transmit impairment.

As stated above, the transmitters 22, 42 include transmit impairment compensators 27, 47 configured to compensate the transmit baseband modulated signal based on the compensation signal. The transmit impairment compensators 27, 47 are positioned between the data modulators 25, 45 and the mixers 28a, 28b, 48a, 48b. Alternatively, the transmit impairment compensator 27 may be implemented within the controller itself if the transmitter chain is routed through the controller 21.

The impairment module 92 is configured to estimate the transmit impairment by comparing the transmit baseband modulated signal with the receive baseband modulated signal while ignoring the receive impairment. The impairment module 92 performs the comparing in a plurality of iterations to determine difference values therebetween. The transmit impairment compensators 27, 47 then perform the compensation by iteratively adding correction values, as provided by the compensation signal, to the transmit baseband modulated signal to compensate for the difference values from the plurality of iterations. A least means square (LMS) algorithm may be used to determine the compensation values, for example.

Operation of the impairment module 92 may be simplified based on additional filtering of the receive baseband modulated signal before being provided as an input to the impairment module 92. In the above embodiment, the controller 21 typically includes a filter 94 that should helpfully be large enough to pass the transmit impairment portion of the signal while rejecting the receive impairment portion of the signal. After the second down-conversion in the auxiliary receiver 21, the transmit impairment signal centers at DC and can be isolated from the receiver impairments using a lowpass filter. This filter 94 isolates the transmit impairment signal so that the controller 21 can compare it to the ideal reference signal and estimate the impairments using the LMS algorithm or a different method.

In another embodiment of this filter 94, a complex filter may be used. The complex filter is used to select the positive frequencies, which are then provided to the impairment module 94 after translating the positive frequencies at zero-IF.

As an alternative to the complex filter, a lossy integrator may filter the zero-IF down-converted signal in the auxiliary receiver 62. This filter can be implemented very simply to have a cascade of filters, each with a single-pole IIR response. This filter implementation is inexpensive, yet very powerful. The filtering operation modifies the in-band frequency components of the auxiliary receiver output signal. Hence, it may be compared to a similarly modified reference signal (i.e., the ideal transmit signal from the data modulators 25, 45). The same LMS update equations can be used to estimate the impairments caused in the transmitter.

The impairment module 94 may also be used to estimate and generate a receive impairment compensation signal to correct for impairments within the auxiliary receiver 62. The auxiliary receiver 62 includes a receive impairment compensation signal for the receive impairment compensator or DSP block 64 within the auxiliary receiver 62.

The receive impairment compensator 64 is at the output of the mixers 68a, 68b. Alternatively, the receive impairment compensator 64 may be implemented within the controller itself if the receive chain is routed through the controller 21. As discussed above for the estimation and compensation of the transmit impairment, an inverse system modeling is also used for the receive impairment As discussed above, complex filtering and very selective complex lossy integrator filtering may be used to provide inputs to the impairment module 92. In addition, the receive impairment may be estimated without requiring the transmit baseband modulated signal. Instead, a very selective complex lossy integrator may be used to extract a portion of the signal spectrum centered at the positive intermediate frequency, and a very selective complex lossy integrator may be used to extract a portion of the signal spectrum centered at the negative intermediate frequency.

Figure 2:
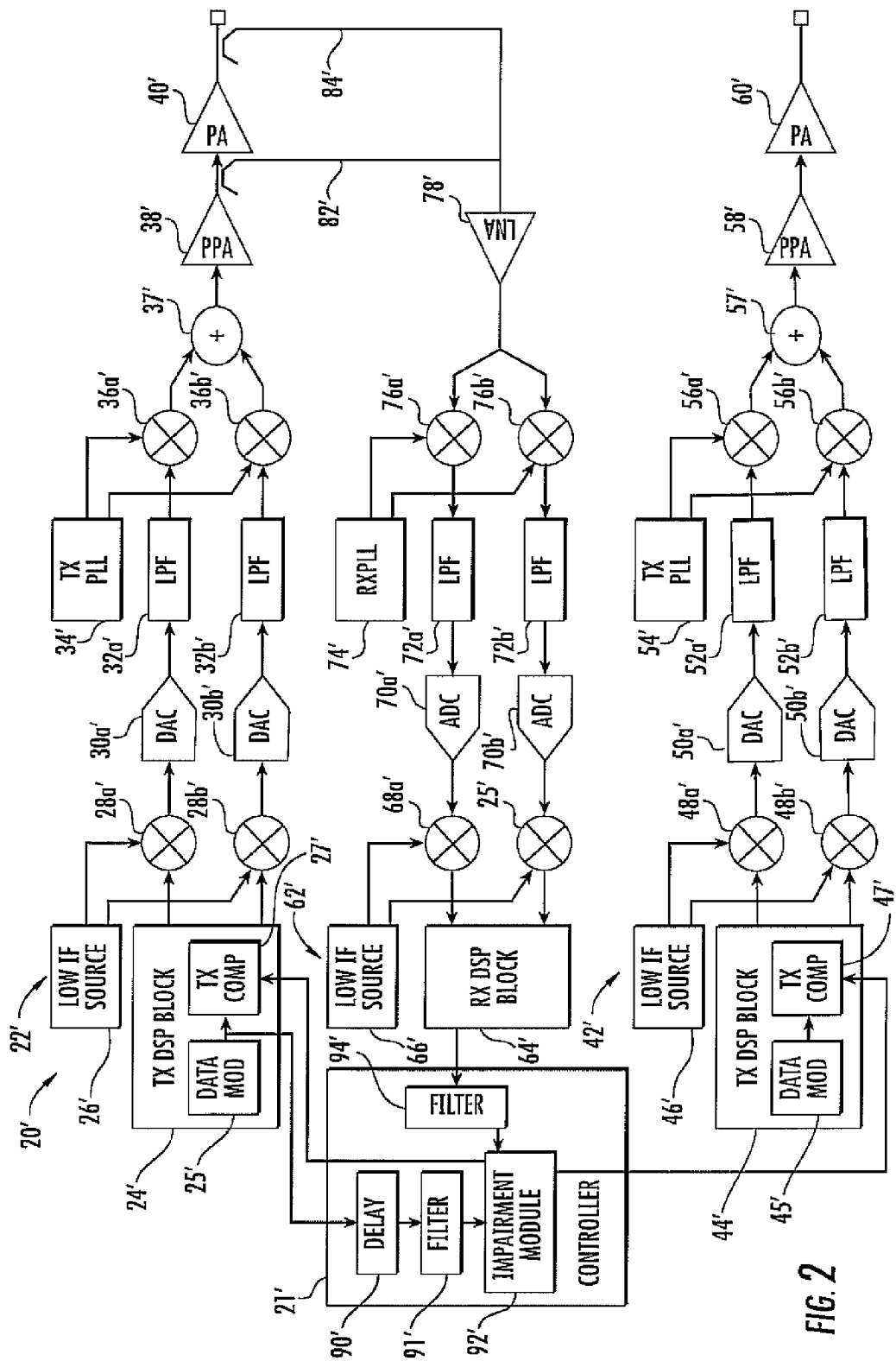
FIG. 2 is a schematic block diagram of a second embodiment of a communications device of the present disclosure.

With reference to FIG. 2, an additional embodiment is now described. Here, the transmitters 22', 42', controller 21', and auxiliary receiver 62' are similar to those described above, and are all integrated in a single integrated circuit. However, in this embodiment, there is no switching block, and the auxiliary receiver is coupled to the output of only one of the transmitters 22'.

Since multiple transmitters implemented in a same integrated circuit are subject to approximately the same temperature, the performance of each transmitter is affected similarly due to heat. Therefore, in some applications, the impairment correction applied by the impairment module 92' and TX compensator 27' to correct the initial IQ imbalance in the transmitter 22', can be applied to the second transmitter 42' to obtain similar results. This reduces the cost of the communications device 20' because less processing power may be used. As such, in this embodiment, the impairment correction applied by the impairment module 92' and TX compensator 47' to the transmitter 42' is the same as, or based upon, the impairment correction applied to the transmitter 22' (based upon the detected IQ imbalance in the transmit signal output by the transmitter 42').

Further details of the auxiliary receiver 62, 62' may be found in U.S. Pat. No. 8,594,579, issued Nov. 26, 2013, assigned to the same assignee as the present application, the contents of which are hereby incorporated by reference in their entirety.

Example components of a hand-held mobile wireless communications device 1000 that may be used in accordance with the present disclosure are further described in the example below with reference to FIG. 3. The device 1000 illustratively includes a housing 1200, a keypad 1400 and an output device 1600. The output device shown is a display 1600, which may comprise a full graphic LCD. In some example embodiments, display 1600 may comprise a touch-sensitive input and output device. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400 by the user. In some example embodiments, keypad 1400 may comprise a physical keypad or a virtual keypad (e.g., using a touch-sensitive interface) or both.

The housing 1200 may be elongated vertically, or may take on other sizes and shapes (including clamshell housing structures). The keypad 1400 may include a mode selection key, or other hardware or software for switching between text entry and telephony entry.

Figure 3:
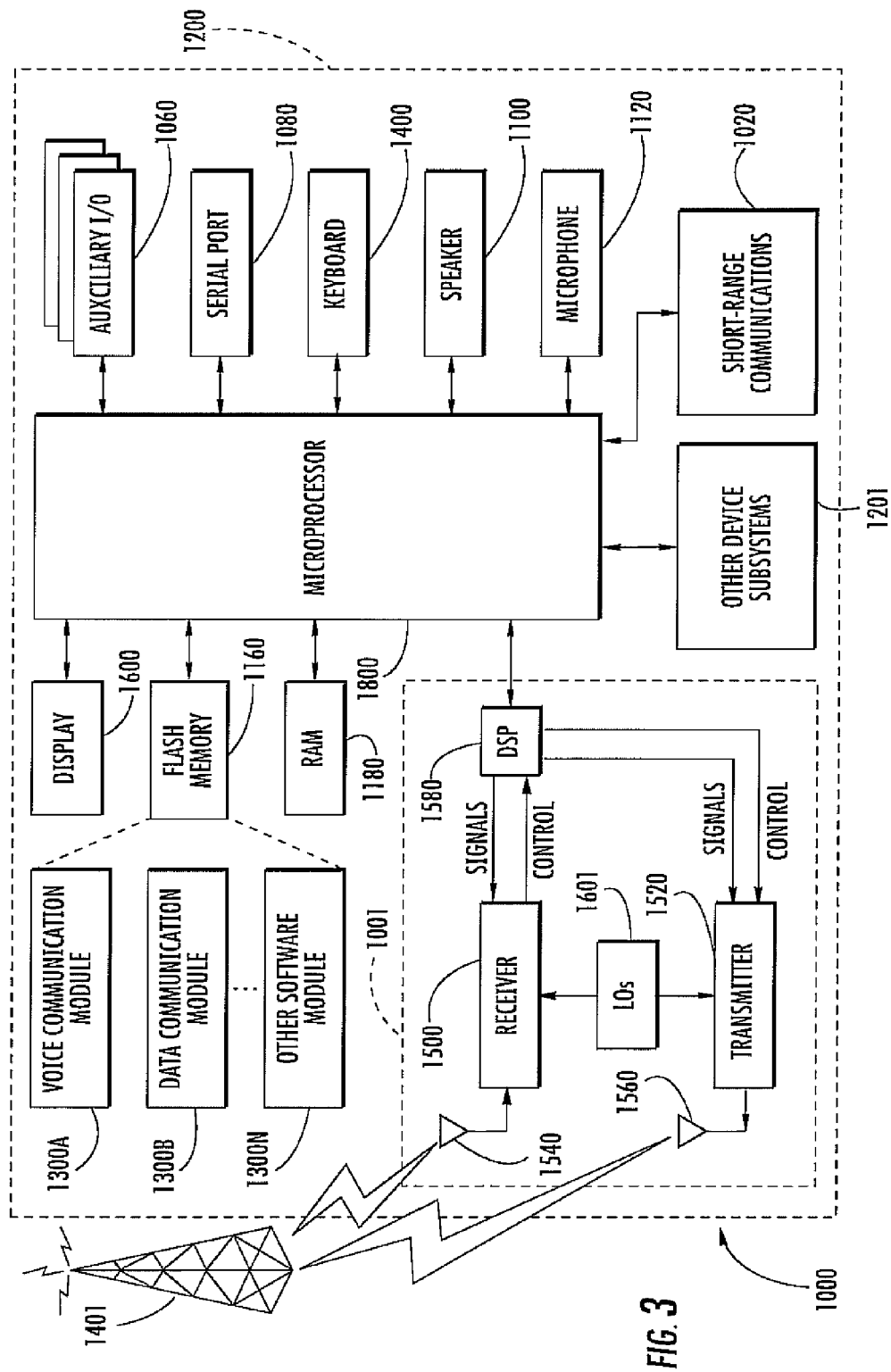
FIG. 3 is a schematic block diagram illustrating components of a mobile wireless communications device in accordance with an example embodiment of the present disclosure.

In addition to the processing device 1800, other parts of the mobile device 1000 are shown schematically in FIG. 3. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having voice and data communications capabilities. In addition, the mobile device 1000 may have the capability to communicate with other computer systems via the Internet.

Operating system software executed by the processing device 1800 may be stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications 1300A-1300N on the device 1000. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with the device user's corresponding data items stored or associated with a host computer system.

Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAC™ or General Packet Radio Service (GPRS) mobile data communications networks, and also designed to operate with any of a variety of voice communications networks, such as AMPS, TDMA, CDMA, WCDMA, PCS, GSM, EDGE, etc. Other types of data and voice networks, both separate and integrated, may also be utilized with the mobile device 1000. The mobile device 1000 may also be compliant with other communications standards such as 3GSM, 3G, UMTS, 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore utilizes a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device user may also compose data items, such as e-mail messages, using the keypad 1400 and/or some other auxiliary I/O device 1060, such as a touchpad, a rocker switch, a thumb-wheel, track ball, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, or a Bluetooth™ communications module to provide for communication with similarly-enabled systems and devices.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A communications device comprising:
a plurality of wireless transmitters operable at different respective frequencies and each configured to generate respective IQ signals having an initial IQ imbalance;
a frequency tunable auxiliary receiver comprising
a low noise amplifier (LNA), and at least one mixer coupled downstream of said LNA, and
a receiver phase locked loop (RXPLL) coupled to said at least one mixer, said RXPLL being tunable to the frequencies of the plurality of wireless transmitters; and
a controller configured to
selectively couple a given wireless transmitter from among the plurality of wireless transmitters to said frequency tunable auxiliary receiver and tune said frequency tunable auxiliary receiver to a frequency of the given wireless transmitter from among the plurality of wireless transmitters, and
apply predistortion to the given wireless transmitter from among the thereof based upon the initial IQ imbalance generated by the given wireless transmitter from among the plurality of wireless transmitters to reduce the initial IQ imbalance.

2. The communications device of claim 1, further comprising a switching block coupled to said controller, said frequency tunable auxiliary receiver, and to each of said plurality of transmitters and operated by said controller.

3. The communications device of claim 1, wherein said frequency tunable auxiliary receiver further comprises at least one analog to digital converter (ADC) coupled downstream of said at least one mixer, and a receiver DSP block coupled to said at least one ADC.

4. A communications device comprising:
a plurality of wireless transmitters operable at different respective frequencies and each configured to generate respective IQ signals having an initial IQ imbalance;
each wireless transmitter from among the plurality of wireless transmitters comprising
a digital signal processing (DSP) block configured to receive an input baseband signal and to generate the IQ signal having the IQ imbalance,
at least one digital to analog converter (DAC) coupled downstream of said DSP block,
at least one mixer coupled downstream of said at least one DAC, and
a phase locked loop (PLL) coupled to said at least one mixer;
a frequency tunable auxiliary receiver;
a switching block coupled to said controller, said frequency tunable auxiliary receiver, and to each of said plurality of transmitters; and
a controller configured to
selectively couple a given wireless transmitter from among the plurality of wireless transmitters to said frequency tunable auxiliary receiver, using said switching block, and tune said frequency tunable auxiliary receiver to a frequency of the given wireless transmitter from among the plurality of wireless transmitters, and
apply predistortion to the given wireless transmitter from among the plurality thereof based upon the initial IQ imbalance to reduce the initial IQ imbalance generated by the given wireless transmitter from among the plurality of wireless transmitters, by generating and applying a predistortion signal to said DSP block.

5. The communications device of claim 4, wherein each wireless transmitter further comprises at least one power amplifier downstream from said at least one mixer.

6. A method of operating a communications device comprising:
selectively coupling a given wireless transmitter from among a plurality of wireless transmitters of the communications device to a frequency tunable auxiliary receiver of the communications device, the plurality of wireless transmitters operable at different respective frequencies and each configured to generate respective IQ signals having an initial IQ imbalance, each wireless transmitter comprising a digital signal processing (DSP) block configured to receive an input baseband signal and to generate the IQ signal having the IQ imbalance, at least one digital to analog converter (DAC) coupled downstream of the DSP block, at least one mixer coupled downstream of the at least one DAC, a phase locked loop (PLL) coupled to the at least one mixer, and at least one power amplifier downstream from the at least one mixer, the communications device also including a frequency tunable auxiliary receiver, and a controller;
tuning the frequency tunable auxiliary receiver to a frequency of the given wireless transmitter from among the plurality of wireless transmitters, using the controller; and
applying predistortion to the given wireless transmitter from among the plurality thereof based upon the initial IQ imbalance from among the plurality of wireless transmitters to reduce the initial IQ imbalance by generating and applying a predistortion signal to the DSP block, using the controller.

7. The method of claim 6, further comprising a switching block coupled to the controller, the frequency tunable auxiliary receiver, and to each of the plurality of transmitters and operated by the controller.

8. A method of operating a communications device comprising:
selectively coupling a given wireless transmitter from among a plurality of wireless transmitters of the communications device to a frequency tunable auxiliary receiver of the communications device, the plurality of wireless transmitters operable at different respective frequencies and each configured to generate respective IQ signals having an initial IQ imbalance, the communications device further comprising a frequency tunable auxiliary receiver comprising a low noise amplifier (LNA), at least one mixer coupled downstream of the LNA, and a receiver phase locked loop (RXPLL) coupled to the at least one mixer, the RXPLL being tunable to the frequencies of the plurality of wireless transmitters, the communications device also including a controller;
tuning the frequency tunable auxiliary receiver to a frequency of the given wireless transmitter from among the plurality of wireless transmitters, using the controller; and
applying predistortion to the given wireless transmitter from among the plurality thereof based upon the initial IQ imbalance from among the plurality of wireless transmitters to reduce the initial IQ imbalance, using the controller.

9. The method of claim 8, wherein the frequency tunable auxiliary receiver further comprises at least one analog to digital converter (ADC) coupled downstream of the at least one mixer, and a receiver DSP block coupled to the at least one ADC.

* * * * *